(12) United States Patent
Bjormander

(10) Patent No.: US 9,950,373 B2
(45) Date of Patent: Apr. 24, 2018

(54) COATED CUTTING TOOL AND METHOD FOR MANUFACTURING THE SAME

(71) Applicant: SANDVIK INTELLECTUAL PROPERTY AB, Sandviken (SE)

(72) Inventor: Carl Bjormander, Spanga (SE)

(73) Assignee: SANDVIK INTELLECTUAL PROPERTY AB, Sandviken (SE)

(*) Notice: Subject to any disclaimer, the term of this patent is extended or adjusted under 35 U.S.C. 154(b) by 151 days.

(21) Appl. No.: 14/653,627

(22) PCT Filed: Dec. 20, 2013

(86) PCT No.: PCT/EP2013/077665
§ 371 (c)(1),
(2) Date: Jun. 18, 2015

(87) PCT Pub. No.: WO2014/096348
PCT Pub. Date: Jun. 26, 2014

(65) Prior Publication Data
US 2015/0298215 A1 Oct. 22, 2015

(30) Foreign Application Priority Data
Dec. 21, 2012 (SE) ........................................ 1200782

(51) Int. Cl.
B23B 27/14 (2006.01)
C23C 16/36 (2006.01)
(Continued)

(52) U.S. Cl.
CPC ................ B23B 27/14 (2013.01); B05D 3/06 (2013.01); B23B 27/141 (2013.01); C23C 16/36 (2013.01);
(Continued)

(58) Field of Classification Search
USPC .......... 51/307, 309; 428/216, 336, 697, 698, 428/699, 701, 702, 704; 407/119;
(Continued)

(56) References Cited

U.S. PATENT DOCUMENTS 4,984,940 A * 1/1991 Bryant .................. B23B 27/145
407/119
5,722,803 A 3/1998 Battaglia et al.
(Continued)

FOREIGN PATENT DOCUMENTS

DE 10332101 2/2005
EP 0693574 A1 1/1996
(Continued)

Primary Examiner — Archene Turner
(74) Attorney, Agent, or Firm — Corinne R. Gorski

(57) ABSTRACT

A coated cutting tool includes a substrate having a rake side, a clearance side and a cutting edge and a coating comprising a first layer and a second layer. The second layer has a sandwich structure of an inner layer, an intermediate layer and an outer layer, wherein the inner layer is exposed through an opening in the outer layer, the opening extending over at least a portion of the width of the cutting edge. Thereby, a double layer is provided in critical areas, whereas a single layer is provided in other areas. The double oxide layer is an aluminum oxide layer. A method for manufacturing the coated cutting tool is also provided.

17 Claims, 4 Drawing Sheets

(51) Int. Cl.
*C23C 16/40* (2006.01)
*C23C 16/56* (2006.01)
*C23C 28/04* (2006.01)
*B05D 3/06* (2006.01)

(52) U.S. Cl.
CPC ............ *C23C 16/403* (2013.01); *C23C 16/56* (2013.01); *C23C 28/04* (2013.01); *C23C 28/042* (2013.01); *C23C 28/044* (2013.01); *B23B 2224/04* (2013.01); *B23B 2224/28* (2013.01); *B23B 2224/32* (2013.01); *B23B 2224/36* (2013.01); *B23B 2228/04* (2013.01); *B23B 2228/08* (2013.01); *B23B 2228/10* (2013.01)

(58) Field of Classification Search
USPC ................ 427/331, 348, 419.1, 419.2, 419.7
See application file for complete search history.

(56) References Cited

U.S. PATENT DOCUMENTS

| | | | |
|---|---|---|---|
| 5,776,588 A | 7/1998 | Moriguchi et al. | |
| 5,861,210 A | 1/1999 | Lenander et al. | |
| 7,153,562 B2* | 12/2006 | Rodmar | B23B 27/145 428/216 |
| 7,431,747 B2 | 10/2008 | Heinrich et al. | |
| 7,470,296 B2* | 12/2008 | Lindholm | B23B 27/141 51/307 |
| 7,695,222 B2* | 4/2010 | Omori | B23B 27/143 407/119 |
| 7,871,715 B2* | 11/2011 | Okada | C22C 29/00 428/701 |
| 2002/0187370 A1* | 12/2002 | Yamagata | C23C 30/005 428/698 |
| 2006/0029831 A1 | 2/2006 | Lindholm et al. | |
| 2006/0194078 A1 | 8/2006 | Heinrich et al. | |

FOREIGN PATENT DOCUMENTS

| | | |
|---|---|---|
| EP | 1793014 A1 | 6/2007 |
| EP | 1803514 A2 | 7/2007 |
| JP | H1071501 A | 3/1998 |
| JP | 2010115737 A | 5/2010 |
| JP | 2012192480 A | 10/2012 |
| JP | 2012223872 A | 11/2012 |
| WO | 2005014210 A1 | 2/2005 |

\* cited by examiner

COATED CUTTING TOOL AND METHOD FOR MANUFACTURING THE SAME

RELATED APPLICATION DATA

This application is a § 371 National Stage Application of PCT International Application No. PCT/EP2013/077665 filed Dec. 20, 2013 claiming priority of SE Application No. 1200782-9 filed Dec. 21, 2012. This application is related to U.S. patent application Ser. No. 14/653,336 filed Jun. 18, 2015 and assigned to the assignee of the present application.

TECHNICAL FIELD

The present invention relates to coated cutting tools made of ceramics, cermet, cemented carbide, polycrystalline diamond, cubic boronitride or high speed steel suitable for turning, milling, drilling or by other chip forming machining methods.

BACKGROUND

Cutting tools made of ceramics, cermet or cemented carbide are usually coated with hard coatings to improve wear resistance and cutting performance. The coatings are usually optimized with respect to different applications. This optimization is often based on the predominant wear mechanism of the particular application. For example, alumina is known to improve resistance to crater wear on the rake side and different refractory metal nitrides, carbides and carbonitrides such as titanium carbonitride are known to improve resistance to abrasive wear on the clearance side. By forming coatings comprising different layers with different properties, the resistance to wear on different parts of the cutting tool and due to different wear mechanisms can be further improved, and with sophisticated tailoring of composition, microstructure, layer thickness, etc. improved performance for a certain application can be achieved. However, this approach remains a compromise between the wear and performance characteristics with respect to different parts of the cutting tool. As a solution to this different post treatments have been used.

U.S. Pat. No. 5,861,210 discloses a cutting tool coated with a multi-layered wear resistant coating including an outermost Ti(C,N,O) or Zr(C,N) layer deposited on an $\alpha$-$Al_2O_3$ layer. The outermost layer is mechanically removed by means of brushing, grinding, polishing or blasting, either from only the cutting edge or from both the rake side and the cutting edge, so that the underlying $\alpha$-$Al_2O_3$ layer is exposed, in order to simultaneously improve wear resistance of rake side and clearance side, and in particular the flaking resistance.

U.S. Pat. No. 5,776,588 discloses a cutting tool coated with a multi-layered wear resistant coating including e.g. an innermost TiCN, an intermediate $Al_2O_3$ layer and an outermost TiN layer. The TiN layer and the $Al_2O_3$ layer are removed by mechanical means such as a vibratory tumbling, brushing, shot blasting, grinding from the cutting edge, so that the innermost TiCN layer is exposed, in order to improve the resistance to chipping of the coating at the cutting edge.

U.S. Pat. No. 7,431,747 discloses a cutting tool coated with a multi-layered wear resistant coating including a aluminum oxide layer deposited on a hard material layer. The aluminum oxide layer is selectively removed by means of laser treatment from at least a portion of the clearance side so that the underlying hard material layer is exposed in order to eliminate disadvantages of having aluminum oxide layers on the clearance side and thereby avoid increase in the width of the wear mark on the clearance side and retention of the resistance to crater wear on the rake side.

SUMMARY

One object of the invention is to enable improvement of a coated cutting tool with regards to one or more of crater wear resistance, flank wear resistance, edge toughness, flaking resistance and resistance to plastic deformation without significantly impairing one or more of the remaining properties.

Another object of the invention is to improve crater wear resistance without impairing the edge security due to flaking and/or insufficient toughness in cutting of steel, more particularly in turning of steel.

Yet another object of the invention is to improve resistance to plastic deformation by decreasing the heat transfer into the substrate from the clearance side and/or the edge without impairing e.g. crater wear resistance in cutting of steel or stainless steel, in particular turning of steel or stainless steel.

Yet another object of the invention is to improve resistance to plastic deformation by decreasing the heat transfer to the substrate from the rake side without impairing edge security in cutting of stainless steel, more particularly in turning of stainless steel.

The objects are achieved by a coated cutting tool and a method of manufacturing the same in accordance with the independent claims.

A coated cutting tool in accordance with one embodiment of the invention comprises a substrate with a rake side, a clearance side and a cutting edge with an edge rounding described by an inscribed ellipse with a first axis along the rake side of W and a second axis along the clearance side of H giving the cutting edge a profile corresponding to the ellipse segment in one quadrant of the at the intersection of the rake side and the clearance side, and a coating with a thickness T comprising a first layer and a second layer deposited on the first layer. The second layer comprises a sandwich structure consisting of an inner aluminum oxide layer, an intermediate layer and an outer aluminum oxide layer, wherein the inner aluminum oxide layer or the intermediate layer is exposed through an opening in the outer aluminum oxide layer and said opening extends over at least a portion of the width of the cutting edge and along at least a portion of the cutting edge in the orthogonal direction. The opening extending at least a portion along the orthogonal direction R is here meant that the opening extends at least a portion along the cutting edge in a direction orthogonal to the width of the cutting edge.

The substrate can be made of ceramics, cermet, cemented carbide, polycrystalline diamond, cubic boronitride or high speed steel. The coated cutting tool can be suitable for turning, milling, drilling or by other chip forming machining methods.

One advantage of in this way having a relatively thin coating thickness on the edge is that this reduces the problem in this region of the coated cutting tool normally associated with thick coatings, such as flaking or lack of toughness.

In one embodiment of the invention the opening extends over at least the whole width of the cutting edge. The whole width is hereby meant the width W of the edge as indicated in FIG. 2.

In one embodiment of the invention the opening extends into the clearance side. One advantage of this is that the edge of the outer layer is further displaced from the cutting edge and hence does not influence the cutting operation. Moreover, flaking of the relatively thick coating due to for example plastic deformation is avoided.

In one embodiment of the invention the opening extends at least H+T+2 mm into the clearance side from the rake side as measured by light optical microscopy in a direction orthogonal to the clearance side. For a cutting tool insert this can be performed by placing the cutting tool insert on a planar surface and observing the clearance side in a direction in parallel with the planar surface. Depending on the insert style, i.e. negative, positive insert, this direction may not be perfectly orthogonal to the clearance side.

In one embodiment of the invention said opening extends into the rake side from the clearance side as measured by light optical microscopy in a direction orthogonal to the rake side. For a cutting tool insert this can be performed by placing the cutting tool insert on a planar surface and observing the rake side in a direction perpendicular to the planar surface. Depending on the insert style, i.e. negative, positive insert, chip breaks etc. this direction may not be perfectly orthogonal to the rake side.

In one embodiment of the invention said opening extends into the rake side, in another embodiment partly into a primary land of the rake side, preferably at least $\delta=50$ μm into the rake side, more preferably at least $\delta=100$ μm into the rake side, most preferably at least $\delta=150$ μm into the rake side. It may be an advantage of having the edge of the outer layer displaced away from the cutting edge and into the primary land. Moving the edge of the outer layer even further than the primary land is not preferred since the thick double layer of the sandwich structure is desired in a surface area subjected to crater wear. The position of the area subjected to crater wear typically depends on the geometry of the insert, the size of the insert and the cutting parameters.

In one embodiment of the invention the opening should preferably not extend more than $\delta=400$ μm into the rake side, more preferably not more than $\delta=300$ μm into the rake side, most preferably not more than $\delta=250$ μm into the rake side.

In one embodiment of the invention the intermediate layer is exposed through the opening in the outer aluminum oxide layer.

In one embodiment of the invention the inner aluminum oxide is exposed at least over the whole width of the cutting edge. In one embodiment the inner aluminum oxide layer is exposed also on the rake side, preferably at least $\delta=50$ μm into the rake side, more preferably at least $\delta=100$ μm into the rake side, most preferably at least $\delta=150$ μm into the rake side. In one embodiment the inner aluminum oxide layer is exposed on the clearance side, preferably at least $\delta=H+T+2$ mm into the clearance side. One advantage of removing the intermediate layer is that material from the workpiece may adhere to the intermediate layer.

The opening is preferably accomplished by using a laser for lift-off of a portion of the outer layer as further explained in the following. By having an outer layer being transparent for the laser beam and an intermediate layer that has a higher absorption coefficient for light, preferably having a higher absorption coefficient for laser light, than the outer layer the light irradiated through the outer layer can be absorbed in the intermediate layer and thereby heat is generated in the intermediate layer whereby the portion of the outer layer is removed. This is typically the situation for nano second pulsed laser ablation. Alternatively the intermediate layer is evaporated directly without essentially no heat formation by the laser beam whereby the outer layer is detached, for example if using a pico second pulsed laser source.

In one embodiment of the invention the inner layer is an inner aluminum oxide layer and the outer layer is an outer aluminum oxide layer, preferably one or both the aluminum oxide layers are made of $\alpha\text{-Al}_2\text{O}_3$, preferably made by PVD or CVD, more preferably CVD.

In one embodiment the aluminum oxide layers has a thickness of 2-10 μm. The thickness of the inner aluminum oxide layer can be different from the thickness of the outer aluminum oxide layer.

In one embodiment the inner aluminum oxide layer is thinner than the outer aluminum oxide layer.

In one embodiment the inner aluminum oxide layer is 1-10 μm, preferably 2-5 μm and the outer aluminum oxide layer is 2-20 μm, preferably 4-10 μm.

Although the $\text{Al}_2\text{O}_3$ layer above is described as a binary layer it should be appreciated that in alternative embodiments of the invention the $\text{Al}_2\text{O}_3$ layer may comprise one or more elements such as for example Zr to form a ternary or a multinary compound such as $(\text{Al},\text{Zr})\text{O}$. The $\text{Al}_2\text{O}_3$ layer may also consist of two or more phases of different composition and microstructure.

In one embodiment of the invention the first layer consists of one or more Ti-based layers selected from titanium carbide, titanium nitride, titanium carbonitride, titanium oxycarbide and titanium oxycarbonitride, hereinafter referred to as a Ti(C,N,O) layer, and has a thickness of 2-15 μm. The Ti(C,N,O) layer or individual layers thereof may in addition to Ti comprise elements selected from one or more of Zr, Hf, V, Nb, Ta, Cr, Mo, W and Al.

In one embodiment of the invention the intermediate layer is made of a 0.1-3.5 μm Ti-based layer, such as one or more layers made of titanium carbide, titanium nitride, titanium carbonitride, titanium oxycarbide and titanium oxycarbonitride, preferably a 0.5-3.5 μm (Al,Ti)(C,O,N) layer, more preferably consisting of 0.6-1 μm (Al,Ti)(C,O), 0.8-1.2 μm TiN, 0.5-0.9 μm Ti(C,O).

The coating may further comprise an outermost color layer serving as wear marker, for example a TiN layer.

The removal of the outer layer, such as the aluminum oxide layer, on or over the cutting edge and optionally on or over the clearance side and optionally at the rake side close to the edge reduces the total thickness of aluminum oxide where it is a disadvantage of having a thick aluminum oxide layer while providing a thick double layer formed by the inner layer and the outer layer in surface areas where it gives an advantage, for example in the crater wear area.

One advantage of an intermediate layer having a color with large contrast to the inner layer and the outer layer is that the intermediate layer may serve as wear marker on the clearance side. By way of example a coating comprising a sandwich structure consisting of $\text{Al}_2\text{O}_3/(\text{Al},\text{Ti})(\text{C},\text{O})/\text{Al}_2\text{O}_3$ as an outermost layer and an opening extending into the clearance side exceeding the distance where flank wear normally occurs will after a removal of the outer aluminum oxide layer in accordance with one embodiment of the present invention have a wear marker without depositing an outermost TiN layer or the like.

A method of manufacturing a coated cutting tool comprising a substrate with a rake side, a clearance side and a cutting edge at the intersection of the rake side and the clearance side, and a coating comprising a first layer and an second layer deposited on the first layer in accordance with one embodiment of the invention comprises the steps of:

depositing the first layer on a surface area extending over each of the rake side, the clearance side and the cutting edge, depositing the second layer comprising a sandwich structure consisting of an inner layer, an intermediate layer and an outer layer on the surface area covered by the first layer, selectively removing the outer layer by lift-off, wherein the sandwich structure is exposed to laser light arranged to irradiate the intermediate layer through the outer layer and being absorbed by the intermediate layer, thereby exposing the inner layer or the intermediate layer through an opening in the outer layer, wherein said opening extends over at least a portion of the width of the cutting edge and along at least a portion of the cutting edge in the orthogonal direction.

In one embodiment of the invention the method further comprises blasting the coated cutting tool subsequently to the step of removing the outer layer. One advantage of this blasting is that the stress state and/or the surface roughness of the inner layer can be influenced, by way of example tensile stresses in the inner layer on the edge can be reduced or compressive stresses may be introduced.

In one embodiment of the invention the blasting removes the exposed intermediate layer, at least on the edge. One advantage of removing the intermediate layer on the edge is that material from the workpiece may adhere to the intermediate layer.

In one embodiment of the invention the method further comprises blasting the coated cutting tool prior to the step of removing the outer layer.

Preferably the coating is deposited using physical vapor deposition (PVD) or chemical vapor deposition (CVD)

In one embodiment of the invention the incidence angle of the laser beam is adjusted such that the laser beam is essentially in parallel with the surface normal of the clearance side.

In one embodiment of the invention the incidence angle of the laser beam is adjusted such that the laser beam is essentially in parallel with the surface normal of the rake side.

In one embodiment of the invention the incidence angle of the laser beam is varied, by way of example using a five-axial positioning system.

In one embodiment of the invention the incidence angle of the laser beam is adjusted such that the laser beam is essentially in parallel with the surface normal of surface of the cutting insert.

One advantage of using laser for removing the outer layer is that the laser technique enables removal on any parts of the coated cutting tool and any shape of the opening formed. Moreover, laser readily can remove layers of $\alpha$-$Al_2O_3$, in contrast to e.g. brushing which only efficiently can remove $\kappa$-$Al_2O_3$.

Other objects, advantages and novel features of the invention will become apparent from the following detailed description of the invention when considered in conjunction with the accompanying drawings and claims.

BRIEF DESCRIPTION OF DRAWINGS

Embodiments of the invention will now be described with reference to the accompanying drawings, wherein.

DETAILED DESCRIPTION

Example 1

Coated cutting tools in accordance with one embodiment of the invention were manufactured. First, cemented carbide CNMG120408-PM substrates with a composition of 7.5 wt-% Co and balance WC, a Hc value of 13 kA/m (using a Foerster Koerzimat CS1.096 according to DIN IEC 60404-7) and a hardness of HV3=15 GPa were manufactured by pressing powder and sintering the pressed bodies. Prior to coating deposition the substrates were edge rounded to about 50 µm by wet blasting.

Figure 1:
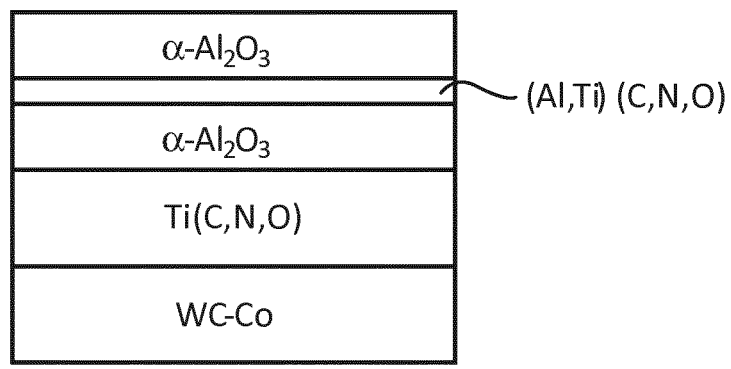
FIG. 1 schematically illustrates a double oxide layer in accordance with the invention, FIG. 2 schematically illustrates a cutting edge of a cutting tool where the outer oxide layer has been removed from a portion of the rake side, the edge and a portion of the clearance side.

Referring to FIG. 1, a coating consisting of a first layer and a second layer was deposited by CVD on the substrates. The first layer is a Ti(C,N,O) layer with a total thickness of 10.3 µm, which consists of the layer sequence 0.4 µm TiN, 9.1 µm MTCVD Ti(C,N), 0.2 µm HTCVD Ti(C,N) and 0.6 µm Ti(C,O). The second layer is a sandwich structure consisting of an inner 4.5 µm $\alpha$-$Al_2O_3$ layer, an intermediate 2.5 µm (Al,Ti)(C,O)/TiN/Ti(C,O) layer and an outer 6.8 µm $\alpha$-$Al_2O_3$ layer. The coating was deposited in a CVD reactor having radial gas flow using deposition conditions for growth of the MTCVD Ti(C,N) layers and the $\alpha$-$Al_2O_3$ layer. A nucleation step was performed prior to growth of the MTCVD Ti(C,N) layer. Oxidation and nucleation steps were performed prior to growth of the $\alpha$-alumina layer.

Figure 2:
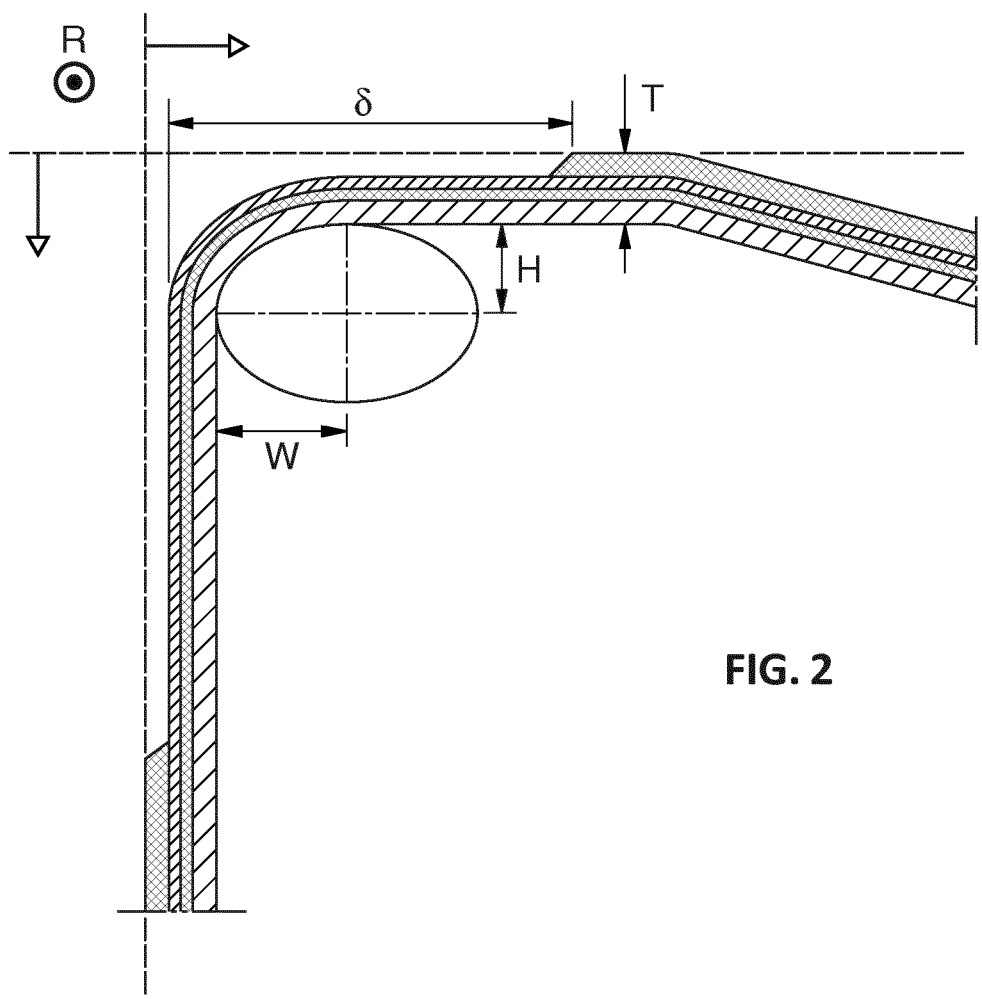
Figure 3:
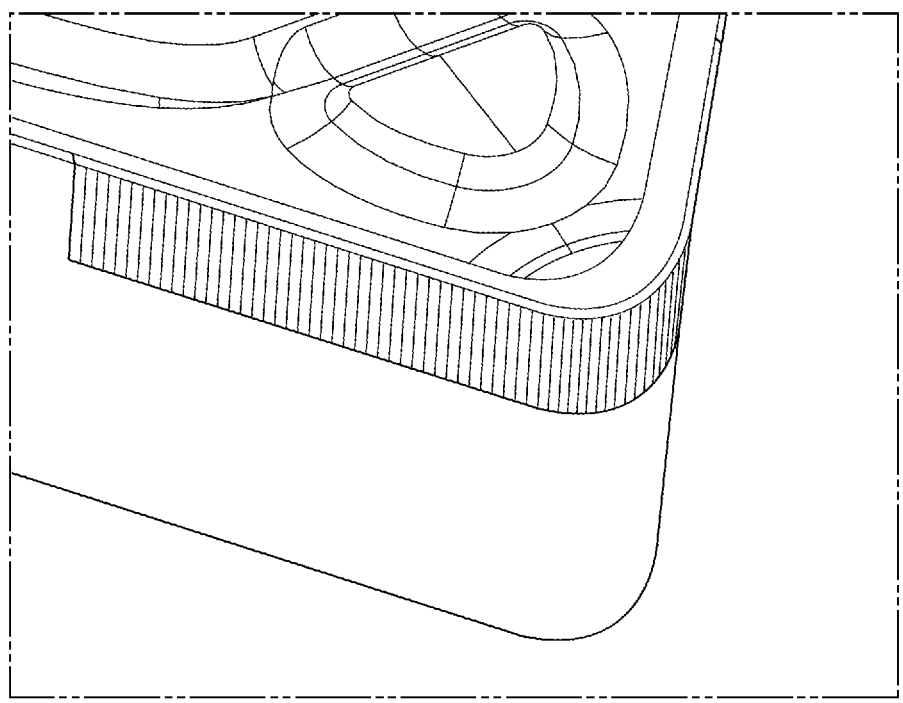
FIG. 3 is a perspective overview image of a cutting edge of a cutting tool in accordance with one embodiment of the invention where laser lift off has removed the outer oxide layer on a portion of the clearance side.

After deposition the coated cutting tools were subjected to a laser operation and a subsequent wet blasting operation. The laser was a diode-pumped YAG laser (Violine) operated at 10 W, 1064 nm, a pulse length of 6 ns (measured at 10 kHz) and a repetition frequency of 20 kHz. A focal lens with 254 mm focal length was used resulting in a spot size of 100 µm. The laser beam was directed in an orthogonal direction to the clearance side at the nose of the cutting tool and an area of 6×2 mm was irradiated in a raster scan with scan lines having a width of 0.1 mm in parallel and orthogonally to the cutting edge, as schematically illustrated in FIG. 2. FIG. 2 also schematically illustrates an inscribed ellipse with the 2W axis and the 2H axis. The beam was displaced with a speed of 400 mm/s and three passes were made. The laser operation removed the outer $\alpha$-$Al_2O_3$ layer and exposed the intermediate layer in an opening extending from the clearance side over the cutting edge an into the rake side. FIG. 3 is an image of the coated cutting tool after laser lift-off.

The wet blasting included both top blasting and side blasting, i.e. with the blasting media bombarding the coated cutting tool to the rake side and the clearance side, respectively, using 220 mesh $Al_2O_3$ particles at a pressure of 1.4-3 bar.

Figure 4:
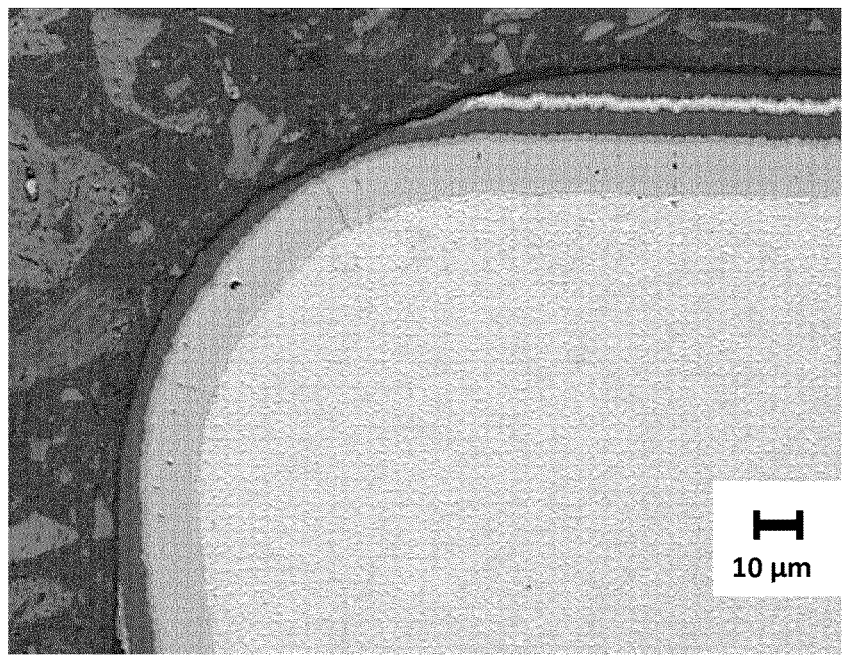
FIG. 4 is a cross-sectional image of a coated cutting tool according to the invention where the inner oxidelayer is exposed in the opening.

The wet blasting removed the intermediate layer in a surface area extending from the edge into the clearance side, see FIG. 4.

Example 2

Figure 5:
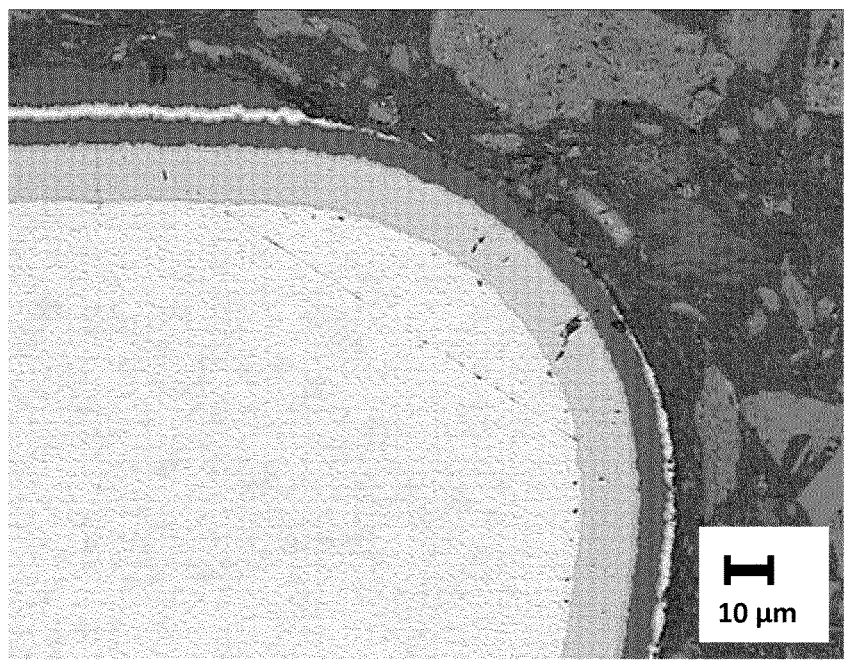
FIG. 5 is a cross-sectional image of a coated cutting tool according to the invention where the inner oxide layer and the intermediate layer are exposed in the opening.

Coated cutting tools were manufactured in accordance with Example 1 except for a different wet blasting operation, where only top blasting was applied, see FIG. 5.

Example 3

Cutting tools according to prior art comprising CNMG120408-PM substrates with a composition of 7.5 wt-% Co and balance WC, a Hc value of 13 kA/m (using a Foerster Koerzimat CS1.096 according to DIN IEC 60404-7) and a hardness of HV3=15 GPa and a coating with a 9 µm first layer of Ti(C,N) and a 4.5 µm second layer of α-$Al_2O_3$ and a Ti(C,N) color layer were manufactured as in Example 2, but without the laser operation. The top blasting operation removed the color layer on the rake side.

Example 4

Cutting tools were manufactured as in Example 2 without removing the second aluminum oxide layer.

Example 5

Cutting tool inserts from Examples 2-4 were tested with respect to flank wear and crater wear by turning in ball bearing steel (Ovako 825B, Tibnor) with depth of cut 2 mm, cutting speed 240 m/min, feed 0.3 mm/rev and using coolant. Tool life criterion for flank wear was for crater wear exceeding 0.2 $mm^2$ and flank wear exceeding $v_B$=0.4 mm, as measured by a light optical microscopy on the rake side and the clearance side, respectively. The tool life is presented in Table 1.

TABLE 1

|  | Tool life (minutes) | | | |
| --- | --- | --- | --- | --- |
|  | Ex. 1 | Ex. 2 | Ex. 3 | Ex. 4 |
| Crater wear | n.a. | >30 | 15 | >30 |
| Flank wear | n.a. | >30 | 18 | >30 |

Example 6

Coated cutting tools of Examples 1-4 were tested in facing of nodular cast iron SS0717 including intermittent cutting operations with coolant under the following conditions.

| Cutting speed, $V_c$ | 170 m/min |
| --- | --- |
| Feed, $f_n$ | 0.1 mm/rev |
| Depth of cut, $a_p$ | 2 mm |

Flaking resistance was evaluated based on the percentage of flaking on the edge was observed after machining. The coated cutting tools of Ex. 1 and 4 did not show any flaking at all, whereas the cutting tool of Example 3 for individual inserts showed either no flaking at all or a flaking from 19 up to 45%. The coated cutting tool of Example 2 showed a flaking degree of from 47 up to 85%.

Example 7

Coated cutting tools in accordance with several embodiment of the invention as well as comparative references were manufactured as follows. First, cemented carbide CNMG120408-PM substrates with a composition of 4.1 wt-% Co and balance WC, a Hc value of 16 kA/m (using a Foerster Koerzimat CS1.096 according to DIN IEC 60404-7) and a hardness of HV3=16 GPa were manufactured by pressing powder and sintering the pressed bodies. Prior to coating deposition the substrates were edge rounded to about 45 µm, as measured as a circle radius (H≈W≈45 µm), by brushing, and subsequently blasted with alumina grits in water at low pressure in order to remove any plastic residue from the brushing process. The blasting pressure was 1.8 bar and the alumina grits were F150 mesh (FEPA 42-1:2006).

Said substrates were coated in three different CVD processes in order to define both references as well as embodiments of the invention and they are all described in the following.

Coating 1, consisting of a first layer and a second layer, was deposited by CVD on the substrates. The first layer is a Ti(C,N,O) layer with a total thickness of 11.3 µm, which consists of the layer sequence 0.4 µm TiN, 10.1 µm MTCVD Ti(C,N), 0.2 µm HTCVD Ti(C,N) and 0.6 µm Ti(C,O). The second layer is a 11.0 µm α-$Al_2O_3$ layer.

Coating 2, shown schematically in FIG. 1, is a coating consisting of a first layer and a second layer that was deposited by CVD on the substrates. The first layer is a Ti(C,N,O) layer with a total thickness of 11.0 µm, which consists of the layer sequence 0.4 µm TiN, 9.8 µm MTCVD Ti(C,N), 0.2 µm HTCVD Ti(C,N) and 0.6 µm Ti(C,O). The second layer is a sandwich structure consisting of an inner 2.9 µm α-$Al_2O_3$ layer, an intermediate 1.2 µm Ti(C,O)/TiN/Ti(C,O) layer and an outer 6.7 µm α-$Al_2O_3$ layer.

Coating 3, consisting of a first layer and a second layer, was deposited by CVD on the substrates. The first layer is a Ti(C,N,O) layer with a total thickness of 11.7 µm, which consists of the layer sequence 0.4 µm TiN, 10.5 µm MTCVD Ti(C,N), 0.2 µm HTCVD Ti(C,N) and 0.6 µm Ti(C,O). The second layer is a 3.0 µm α-$Al_2O_3$ layer.

These three coating variants 1, 2 and 3 were deposited in a CVD reactor having radial gas flow using deposition conditions for growth of the MTCVD Ti(C,N) layers and the α-$Al_2O_3$ layer. A nucleation step was performed prior to growth of the MTCVD Ti(C,N) layer. Oxidation and nucleation steps were performed prior to growth of the α-alumina layer.

After the CVD deposition the coated cutting tools were subjected to posttreatments, where 1b and 2b were subjected to a laser operation on the clearance side, coated cutting tools 2c, 2d where subjected to a first laser treatment on the clearance side and a second laser treatment with a shadow mask present on the rake side, while tools 1a, 2a, 3a were not laser treated.

The laser used was a diode-pumped YAG laser (Violine 3 from Laservall) operated at 10 W, 1064 nm, a pulse length of 6 ns (measured at 10 kHz) and a repetition frequency of 20 kHz. A focal lens with 254 mm focal length was used resulting in a spot size of 100 µm. The laser beam was directed in an orthogonal direction to the clearance side at the nose of the cutting tool and an area of 6×2 mm was irradiated in a raster scan with scan lines having a width of 0.1 mm in parallel and orthogonally to the cutting edge, as schematically illustrated with arrow in FIG. 2. The beam was displaced with a speed of 750 mm/s and two passes were made. The laser operation removed the outer $\alpha$-$Al_2O_3$ layer and exposed the intermediate layer in an opening extending from the clearance side over the cutting edge an into the rake side. FIG. 2 also schematically illustrates an inscribed ellipse with the 2W axis and the 2H axis and the total coating thickness T. The distance $\delta$ is also shown in FIG. 2, defined as a distance $\delta$ from the exposed cutting edge to the edge of the remaining outer $\alpha$-$Al_2O_3$ layer as seen from the rake side. The distance $\delta$ was measured by light optical microscopy in a direction orthogonal to the rake side when the cutting tool is resting on a flat surface opposite the rake side. The direction R is a direction ortogonal to the width of the cutting edge. The width is measured in the same plane and direction as $\delta$.

The laser lift-off treatment on the clearance side remove the outer $\alpha$-$Al_2O_3$ layer on the whole width of the edge of the coated cutting tools, and into the rake side, to a distance $\delta$ of about 50 µm of tool 1b and about 60 µm for tool 2b.

As a mean to control the extent of removal of the outer $\alpha$-$Al_2O_3$ layer on the rake side on tools 2c and 2d a cemented carbide shadow mask was used to define the extension of such a removal in a controlled way. The shadow mask protects the layers beneath the mask from being exposed of the laser and thereby the outer $\alpha$-$Al_2O_3$ layer is not being removed from the area beneath the shadow mask. Different shadow masks were used in order to enable different distances $\delta$ of the outer $\alpha$-$Al_2O_3$ layer being removed from edge and into the rake side in the laser process on the rake side. The distance $\delta$ is measured as the distance from the exposed cutting edge as seen from the rake side as disclosed above, and to the edge of the remaining outer $\alpha$-$Al_2O_3$ layer.

The laser treatment were for all the examples extended in the direction of the cutting edge to a position outside the cutting depth.

Four different exposed distances $\delta$ from the edge into the rake side were thus manufactured, about 50 µm, about 60 µm, about 130 µm and about 200 µm. Tools provided with coating 1 was subjected to a laser operation removing the outer $\alpha$-$Al_2O_3$ layer on the rake side from the edge to a distances $\delta$ of about 50 µm. Tools provided with coating 2 were subjected to a laser operation removing the outer $\alpha$-$Al_2O_3$ layer on the rake side from the edge to a distances $\delta$ of about 60 µm, about 130 µm and about 200 µm respectively. The resulting average distance $\delta$ for the laser treated tool 1b, 2b, 2c and 2d is shown in Table 2.

TABLE 2

| Tool | 1b | 2b | 2c | 2d |
|---|---|---|---|---|
| Average distance $\delta$ (µm) | 50 | 60 | 130 | 200 |

Finally a wet blasting was performed on the rake sides of all the cutting tools, here called a final top blasting. The aim of this treatment was to introduce compressive stresses into the outermost coatings and thereby increase the edge toughness of the tools. The aim was further to smoothen the edge of the remaining outer $\alpha$-$Al_2O_3$ layer and to remove the intermediate layer in the exposed surface area. The blaster slurry consisted of 20 vol-% alumina grits in water and an angle of 90° between the rake side of the cutting insert and the direction of the blaster slurry. The distance between the gun nozzle and the surface of the insert was about 145 mm. The pressure of the slurry to the gun was 1.8 bar for all samples, while the pressure of air to the gun was 2.1 bar for all tools. The alumina grits were F220 mesh (FEPA 42-1: 2006). The time for blasting per area unit was about 4 seconds. A summary of the coated cutting tools 1a, 1b, 2a, 2b, 2c, 2d, and 3a manufactured in Example 7 is presented in Table 3.

Figure 6:
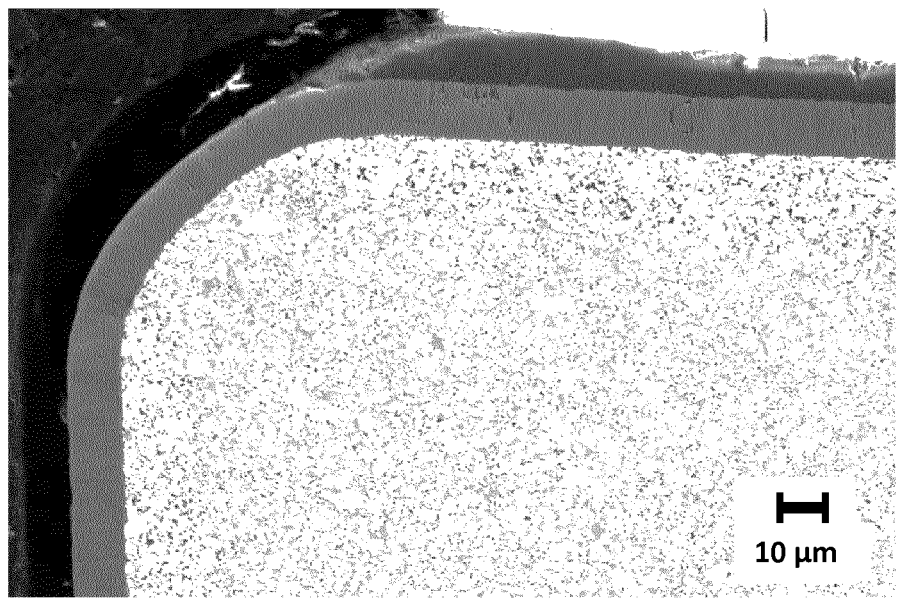
FIG. 6 is a cross-sectional image of a coated cutting tool wherein the first layer is exposed in the opening (cutting tool 1b)
Figure 7:
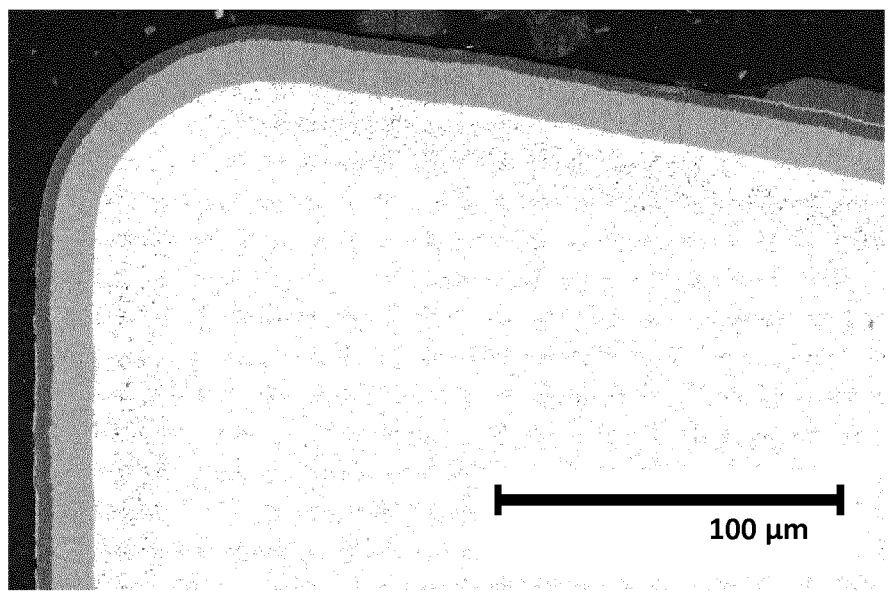
FIG. 7 is a cross-sectional image of a coated cutting tool in accordance to one embodiment of the invention wherein the inner oxide layer is exposed in the opening (cutting tool 2d).

A cross sectional image of the coated cutting tool 1b is shown in FIG. 6 and a corresponding image of the coated cutting tool 2d is shown in FIG. 7.

TABLE 3

| Tool | First layer TiCN (µm) | Inner $\alpha$-$Al_2O_3$ layer (µm) | Outer $\alpha$-$Al_2O_3$ layer, (µm) | Laser treatment Clearance side | Laser treatment Rake side with shadow mask | Final topblasting |
|---|---|---|---|---|---|---|
| 1a | 11.3 | — | 11.0 | No | No | Yes |
| 1b | 11.3 | — | 11.0 | Yes | No, $\delta$ = 50 µm | Yes |
| 2a | 11.0 | 2.9 | 6.7 | No | No | Yes |
| 2b | 11.0 | 2.9 | 6.7 | Yes | No, $\delta$ = 60 µm | Yes |
| 2c | 11.0 | 2.9 | 6.7 | Yes | Yes, $\delta$ = 130 µm | Yes |
| 2d | 11.0 | 2.9 | 6.7 | Yes | Yes, $\delta$ = 200 µm | Yes |
| 3a | 11.7 | — | 3.0 | No | No | Yes |

Example 8—Toughness Test

The coated cutting tools 1a, 2a, 2b, 2c, 2d, 3a of Example 7 were tested in a toughness test.

The work piece material consist of two carbon steel bars (Fe 360BFN), mounted parallel to each other with a distance between them. In longitudinal turning of this work piece the cutting tool will be exposed to two interruptions per revolution. In this test the toughness of the cutting tool has shown to be critical for its lifetime. The following cutting data was used;
Cutting speed $v_c$: 130 m/min
Depth of cut $a_p$: 1.5 mm
Water miscible metal working fluid was used.

The cutting feed was increased continuously during the test. The start value was 0.15 mm/revolution. After 1 minute of cutting the feed value was 0.20 mm/revolution and after 2 minutes of cutting, the feed value was 0.25 mm/revolution, and after 3 minutes of cutting the feed value was 0.30 mm/revolution.

An equipment for measuring the cutting forces was used. When an insert breakage occurred the cutting force increased clearly and the machine was stopped. 25 cutting edges were evaluated per cutting tool variant. The actual value of the cutting feed at fracture for each one of the 25 cutting edges was registered. The values were sorted from the lowest fracture feed value to the highest, for each cutting tool variant. The wear performance is shown in Table 4, presenting the feed at fracture for edge number 6, the median value of all 25 edges and the value for edge number 20.

TABLE 4

| | | Coated cutting tool | | | | | |
|---|---|---|---|---|---|---|---|
| | | 1a | 2a | 2b | 2c | 2d | 3a |
| Feed at fracture (mm/revolution) | Rank 6 | 0.21 | 0.19 | 0.21 | 0.21 | 0.23 | 0.28 |
| | Median | 0.23 | 0.21 | 0.23 | 0.22 | 0.24 | 0.29 |
| | Rank 20 | 0.25 | 0.22 | 0.25 | 0.24 | 0.25 | 0.30 |

As can be seen in the Table 4 the tool 3a, comprising the relatively thin outer α-Al$_2$O$_3$ layer shows the best performance in this test and the tool 2a comprising a relatively thick outer α-Al$_2$O$_3$ layer shows a shorter time to fracture. The laser treated tool 2d shows a edge toughness performance in between the performance of tool 3a and tool 2a. Thus, the edge line toughness is slightly better for the laser treated tool 2d as compared to the tool 2a with a relatively thick outer α-Al$_2$O$_3$ layer on the edge. Tool 2d performs slightly better than the tools 2b and 1a in this test.

Example 9—Crater Wear Test

The coated cutting tools according to table 1 in Example 7, i.e. tools 1a, 1b, 2a, 2b, 2c, 2d, 3a were tested in longitudinal turning in ball bearing steel (100CrMo7-3) using the following cutting data;
Cutting speed v$_c$: 240 m/min
Cutting feed, f: 0.3 mm/revolution
Depth of cut, a$_p$: 2 mm
Insert style: CNMG120408-PM
Water miscible metal working fluid was used.
One cutting edge per cutting tool was evaluated.

In analyzing the crater wear, the area of removed material on the rake side (crater wear) was measured, using a light optical microscope. The wear of each cutting tool was evaluated after 2 minutes cutting in the light optical microscope. The cutting process was then continued with a measurement after each 2 minutes run. Beside crater wear, flank wear and build up edge was also observed. The results are shown in Table 5.

TABLE 5

| Coated cutting tool | Crater area after 14 min (mm$^2$) | Crater area after 20 min (mm$^2$) | Crater area after 24 min (mm$^2$) |
| --- | --- | --- | --- |
| 1a, 2a, 2b, 2c, 2d | 0 | 0 | 0 |
| 1b | 0 | * | * |
| 3a | 0.02 | 0.26 | 0.43 |

* The tool 1b with no α-Al$_2$O$_3$ in the edgeline reached its life time due to excessive flank wear after 16 minutes.

As can be seen in Table 5, it was only the cutting tool 3a that showed crater wear. The cutting tool 1b reached its lifetime due to excessive flank wear after 16 minutes cutting. Cutting tool 1b is the only cutting tool in this test that did not comprise an alumina layer as the outermost layer at the cutting edge and clearance side. All the cutting tools with a relatively thick aluminum oxide at the crater area on the rake side showed good resistance against crater wear in this test.

The crater wear area in this test started at a distance of about 300 μm from the exposed cutting edge, measured by light optical microscope as the shortest distance in the plane of the rake side.

Example 10—Flank and Crater Wear Test

The coated cutting tools according to Table 1 in Example 7, i.e. tools 1a, 1b, 2a, 2b, 2c, 2d, 3a were tested in longitudinal turning in ball bearing steel (100CrMo7-3) using the following cutting data;
Cutting speed v$_c$: 255 m/min
Cutting feed, f: 0.3 mm/revolution
Depth of cut, a$_p$: 2 mm
Insert style: CNMG120408-PM
Water miscible metal working fluid was used.
One cutting edge per cutting tool was evaluated.

In analyzing the flank wear, the distance from the edge line to the bottom of the flank wear pattern, as seen perpendicular to the clearance side, was measured using a light optical microscope. In analyzing the crater wear, the area of removed material on the rake side (crater wear) was measured, using a light optical microscope. The wear of each cutting tool was evaluated after 4 minutes cutting in the light optical microscope. The cutting process was then continued with a measurement after each 4 minutes run. Beside crater wear, flank wear and build up edge were also observed. The results are shown in Table 6.

TABLE 6

| Coated cutting tool | Flank wear at main cutting edge (mm) | Flank wear at secondary cutting edge (mm) | Time until flank wear reached or exceeded 0.4 mm (min) |
| --- | --- | --- | --- |
| 1a | 0.43 | 0.36 | 34 |
| 1b | 0.40 | 0.30 | 12 |
| 2a | 0.41 | 0.34 | 36 |
| 2b | 0.43 | 0.48 | 24 |
| 2c | 0.43 | 0.41 | 28 |
| 2d | 0.41 | 0.32 | 28 |
| 3a | 0.33* | 0.28* | 20* |

*The cutting tool 3a with a relatively thin α-Al$_2$O$_3$ at the whole insert reached life time due to crater wear.

As can be seen in Table 6, the cutting tools 1a and 2a, i.e. the tools with the relatively thickest aluminium oxide over the edge, showed the highest resistance to flank wear. The cutting tools 1b, with no aluminum oxide over the edge, showed the lowest resistance to flank wear. The cutting tools 2b, 2c, 2d showed a higher flank wear resistance as compared to cutting tools 1b. The cutting tool 3a, with a relatively thin aluminum oxide layer covering the whole tool, showed crater wear in this test and the test was stopped before the flank wear criteria 0.4 mm was reached. The cutting tool 2d showed a higher wear resistance compared to 2b.

Also in this test, the crater wear area started at a distance of about 300 μm from the exposed cutting edge, measured as the shortest distance in the plane of the rake side.

Example 11—Flank and Crater Wear Test

The coated cutting tools according to table 1 in Example 7, i.e. samples 1a, 1b, 2a, 2b, 2c, 2d, 3a were tested in longitudinal turning in ball bearing steel (100CrMo7-3) using the following cutting data;
Cutting speed v$_c$: 270 m/min
Cutting feed, f: 0.3 mm/revolution
Depth of cut, a$_p$: 2 mm
Insert style: CNMG120408-PM
Water miscible metal working fluid was used.
One cutting edge per cutting tool was evaluated.

In analyzing the flank wear, the distance from the edge line to the bottom of the flank wear pattern, as seen perpendicular to the clearance side, was measured using a light optical microscope. In analyzing the crater wear, the area of removed material on the rake side (crater wear) was measured, using a light optical microscope. The wear of each cutting tool was evaluated after 4 minutes cutting in the light optical microscope. The cutting process was then continued with a measurement after each 4 minutes run. Beside crater wear, flank wear and build up edge was also observed. The results after 22 minutes are shown in Table 7.

TABLE 7

| Coated cutting tool after 22 minutes. | Flank wear at main cutting edge (mm) | Flank wear at secondary cutting edge (mm) | Crater wear (mm$^2$) |
|---|---|---|---|
| 2b | 0.34 | 0.40 | 0.06 |
| 2c | 0.32 | 0.29 | 0.00 |
| 2d | 0.30 | 0.28 | 0.00 |

* The cutting tool 3a with thin α-Al$_2$O$_3$ at the whole insert reached its life time due to crater wear.

As shown in Table 7, the flank wear resistance is slightly higher for the cutting tool 2d as compared to the cutting tools 2b and 2c. The reason for this might be that a laser lift off close to the edge effects the shape and micro geometry of the cutting edge.

The crater wear area in this test started at a distance of about 300 μm from the exposed cutting edge, measured as the shortest distance in the plane of the rake side.

While the invention has been described in connection with various exemplary embodiments, it is to be understood that the invention is not to be limited to the disclosed exemplary embodiments, on the contrary, it is intended to cover various modifications and equivalent arrangements within the appended claims.

The invention claimed is:

1. A coated cutting tool comprising:
    a substrate with a rake side, a clearance side and a cutting edge with an edge rounding described by an inscribed ellipse with a first axis along the rake side of W and a second axis along the clearance side of H at the intersection of the rake side and the clearance side; and
    a coating with a thickness T, the coating including a first layer and a second layer deposited on the first layer, wherein the second layer comprises a sandwich structure of an inner aluminum oxide layer, an intermediate layer and an outer aluminum oxide layer, wherein the inner aluminum oxide layer is exposed through an opening in the outer aluminum oxide layer and said opening extends over at least a portion of the width of the cutting edge, along at least a portion of the cutting edge in the orthogonal direction, and at least H+T+2 mm into the clearance side from the rake side.

2. The coated cutting tool of claim 1, wherein the opening extends over at least the whole width of the cutting edge.

3. The coated cutting tool of claim 2, wherein the inner aluminum oxide is exposed at least over the whole width of the cutting edge.

4. The coated cutting tool of claim 1, wherein the opening extends into the rake side.

5. The coated cutting tool of claim 1, wherein the opening extends partly into a primary land of the rake side.

6. The coated cutting tool of claim 1, wherein the opening extends at least 50 μm into the rake side.

7. The coated cutting tool of claim 1, wherein the opening extends at least 100 μm into the rake side.

8. The coated cutting tool of claim 1, wherein the intermediate layer is exposed through the opening in the outer aluminum oxide layer.

9. The coated cutting tool of claim 1, wherein said aluminum oxide layers are made of α-Al2O3.

10. The coated cutting tool of claim 1, wherein the thickness of the inner and outer aluminum oxide layers is 2-10 μm.

11. The coated cutting tool of claim 1, wherein the thickness of the inner aluminum oxide layers is 1-10 μm.

12. The coated cutting tool of claim 11, wherein the thickness of the inner aluminum oxide layers is 2-5 μm and the outer aluminum oxide layer is 4-10 μm.

13. The coated cutting tool of claim 1, wherein the first layer includes one or more layers selected from titanium carbide, titanium nitride, titanium carbonitride, titanium oxycarbide and titanium oxycarbonitride, and has a thickness of 2-15 μm.

14. A method of manufacturing a substrate having a rake side, a clearance side and a cutting edge at the intersection of the rake side and the clearance side, and a coating including a first layer and a second layer deposited on the first layer, wherein the method comprises the steps of:
    depositing the first layer on a surface area extending over each of the rake side, the clearance side and the cutting edge;
    depositing the second layer comprising a sandwich structure of an inner aluminum oxide layer, an intermediate layer and an aluminum oxide outer layer on the surface area covered by the first layer; and
    selectively removing the outer aluminum oxide layer by lift-off, wherein the sandwich structure is exposed to laser light arranged to irradiate the intermediate layer through the outer aluminum oxide layer and being absorbed by the intermediate layer, thereby exposing the inner aluminum oxide layer through an opening in the outer aluminum oxide layer, wherein said opening extends over at least a portion of the width of the cutting edge, along at least a portion of the cutting edge in the orthogonal direction, and at least H+T+2 mm into the clearance side from the rake side.

15. The method of claim 14, further comprising blasting the coated cutting tool subsequently to the step of removing the outer aluminum oxide layer.

16. The method of claim 15, wherein the blasting removes the exposed intermediate layer, at least on the edge.

17. The method of claim 14, further comprising blasting the coated cutting tool prior to the step of removing the outer layer.

* * * * *